(12) United States Patent
Muharemovic et al.

(10) Patent No.: US 11,791,974 B2
(45) Date of Patent: *Oct. 17, 2023

(54) ELECTRICAL BALANCED DUPLEXER-BASED DUPLEXER

(71) Applicant: Apple Inc., Cupertino, CA (US)

(72) Inventors: Nedim Muharemovic, Nuremberg (DE); Joonhoi Hur, Sunnyvale, CA (US); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/899,556

(22) Filed: Aug. 30, 2022

(65) Prior Publication Data

US 2022/0416991 A1 Dec. 29, 2022

Related U.S. Application Data

(63) Continuation of application No. 17/188,574, filed on Mar. 1, 2021, now Pat. No. 11,438,131, which is a
(Continued)

(51) Int. Cl.
*H04L 5/14* (2006.01)
*H04L 1/04* (2006.01)
(Continued)

(52) U.S. Cl.
CPC .............. *H04L 5/1461* (2013.01); *H03H 7/42* (2013.01); *H03H 11/28* (2013.01);
(Continued)

(58) Field of Classification Search
CPC .... H04B 1/04; H04B 1/16; H04B 1/18; H04L 5/1461; H03H 7/42; H03H 11/28; H03H 11/344
See application file for complete search history.

(56) References Cited

U.S. PATENT DOCUMENTS 5,867,072 A 2/1999 Logothetis
7,277,403 B2 * 10/2007 Frank .................. H03H 9/6433
370/290
(Continued)

FOREIGN PATENT DOCUMENTS

EP 2733855 B1 5/2014

OTHER PUBLICATIONS

"Enrico Manuzzato et al., digitally-controlled electrical balance duplexer for transmitter-receiver isolation in full-duplex radio", 2016, 22th European Wireless Conference, 8 pages. (Year: 2016).*
(Continued)

*Primary Examiner* — Rasheed Gidado
(74) *Attorney, Agent, or Firm* — FLETCHER YODER PC

(57) ABSTRACT

An electrical balance duplexer (EBD) may be used to isolate a transmitter and receiver that share a common antenna. By using impedance gradients to provide impedances that cause balance-unbalance transformers (balun) of the EBD to cut-off access to the common antenna rather than duplicate the antenna impedance, the EBD is balanced. Such cut-offs may have a lower insertion loss than an EBD that merely duplicates the antenna impedance to separate the differential signals of the receiver/transmitter from the common mode signal.

20 Claims, 11 Drawing Sheets

Related U.S. Application Data continuation of application No. 16/582,769, filed on Sep. 25, 2019, now Pat. No. 10,938,542.

(51) Int. Cl.

| | | |
|---|---|---|
| *H03H 7/42* | (2006.01) | |
| *H03H 11/28* | (2006.01) | |
| *H03H 11/34* | (2006.01) | |
| *H04B 1/04* | (2006.01) | |
| *H04B 1/16* | (2006.01) | |

(52) U.S. Cl.
CPC ............ *H03H 11/344* (2013.01); *H04B 1/04* (2013.01); *H04B 1/16* (2013.01)

(56) References Cited

U.S. PATENT DOCUMENTS

| | | |
|---|---|---|
| 7,936,171 B2 | 5/2011 | Hu et al. |
| 8,472,894 B2 | 6/2013 | Wang et al. |
| 8,792,836 B2 | 7/2014 | Mikhemar et al. |
| 8,830,881 B2 * | 9/2014 | Mikhemar ............... H01Q 1/50 370/278 |
| 8,971,219 B2 | 3/2015 | Choksi |
| 9,000,860 B2 | 4/2015 | Mikhemar et al. |
| 9,094,104 B2 | 7/2015 | Din et al. |
| 9,143,307 B2 * | 9/2015 | Mikhemar ............. H04L 5/1461 |
| 9,154,289 B2 | 10/2015 | Mikhemar et al. |
| 9,214,918 B2 | 12/2015 | Mikhemar et al. |
| 9,374,127 B2 * | 6/2016 | Lehtinen ................ H04B 1/525 |
| 9,548,715 B2 | 1/2017 | Van Liempd et al. |
| 9,923,593 B2 | 3/2018 | Andersson et al. |
| 9,948,446 B2 | 4/2018 | Van Liempd et al. |
| 10,200,079 B2 | 2/2019 | Din et al. |
| 10,523,176 B2 * | 12/2019 | van Liempd .......... H03H 7/463 |
| 10,530,615 B1 | 1/2020 | Hur et al. |
| 10,581,478 B1 | 3/2020 | Tam et al. |
| 2007/0296522 A1 | 12/2007 | Takamine |
| 2009/0289721 A1 | 11/2009 | Rajendran et al. |
| 2016/0182006 A1 | 6/2016 | Larson |
| 2017/0187510 A1 | 6/2017 | Van Liempd et al. |

OTHER PUBLICATIONS

"Barend Van Liempd et al., A +70-dBm IIP3 Electrical-Balance Duplexer for Highly Integrated Tunable Front-Ends", Dec. 2016, IEEE Transactions on Microwave Theory and Techniques, vol. 64, No. 12. (Year: 2016).*

Leo Laughlin, et al., "Electrical Balance Duplexing for Small Form Factor Realization of In-Band Full Duplex", IEEE Communications Magazine, May 2015, 10 pages.

* cited by examiner

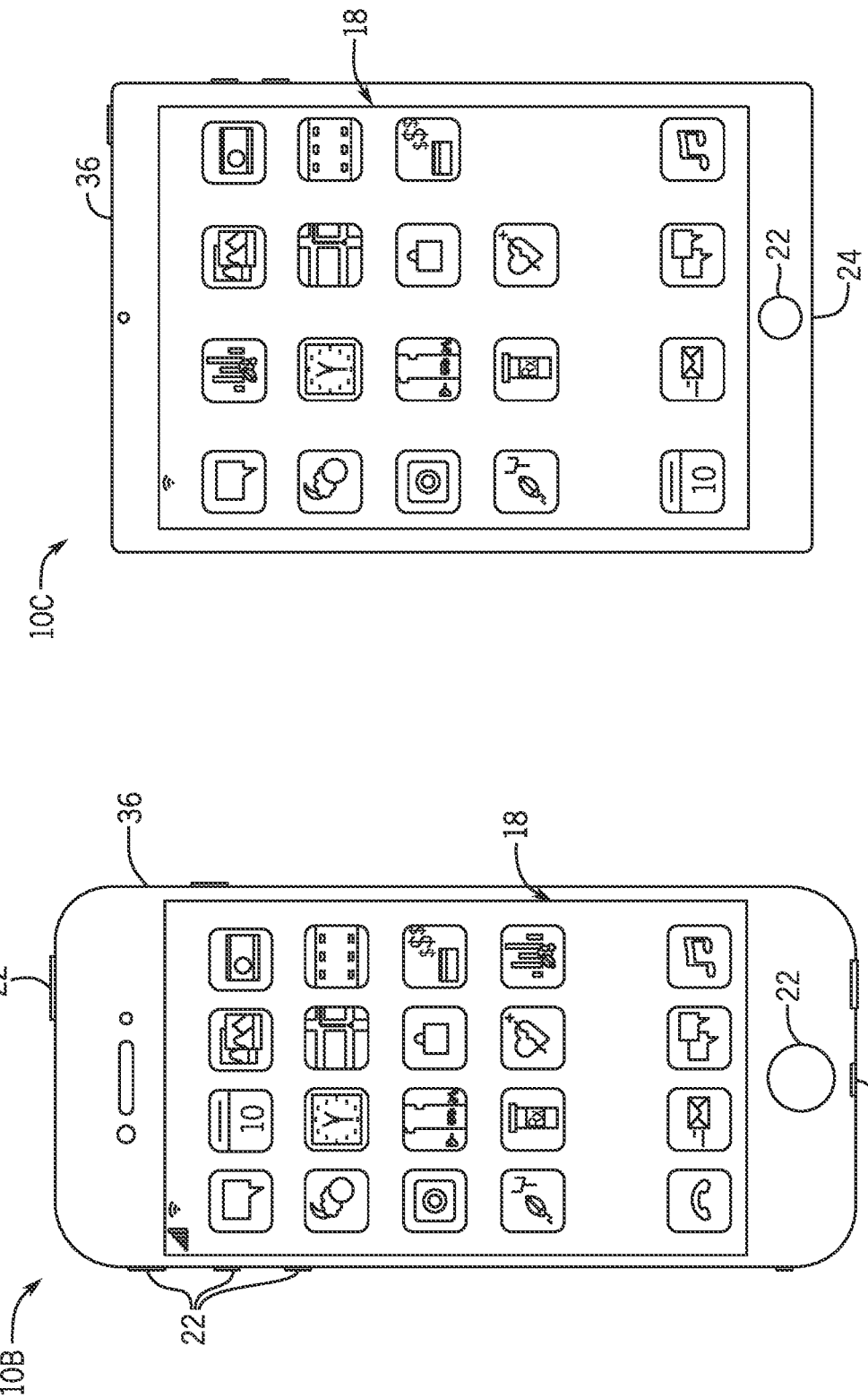

ELECTRICAL BALANCED DUPLEXER-BASED DUPLEXER

CROSS-REFERENCE TO RELATED APPLICATIONS

This application is a continuation of U.S. patent application Ser. No. 17/188,574, entitled "ELECTRICAL BALANCED DUPLEXER-BASED DUPLEXER," filed on Mar. 1, 2021, which is a continuation of U.S. patent application Ser. No. 16/582,769, entitled "ELECTRICAL BALANCED DUPLEXER-BASED DUPLEXER", filed on Sep. 25, 2019, which issued as U.S. Pat. No. 10,938,542 on Mar. 2, 2021, each of which is incorporated by reference herein in its entirety for all purposes.

BACKGROUND

The present disclosure relates generally to wireless communication systems and, more specifically, to systems and methods for electrical balanced duplexer (EBD)-based power amplifier duplexers (PADs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers may be coupled to an antenna to enable an antenna to both receive and transmit from an electronic device. Certain of these electronic devices may use PADs to isolate the transmitter and receiver ports from each other and control connection of the transmitters/receivers to the antenna. The PADs may include multiple duplexers and switches to provide isolation between the transmitter and receiver ports. Since the applications for the antenna, the transmitters, and the receivers may be diverse, the PADs may include numerous band pass filters that are frequency-dependent. In other words, to increase flexibility additional band pass filters may be added to the PAD. However, additional band pass filters consume additional space and add costs to manufacture of the electrical device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Certain wireless electronic devices use duplexers to enable transmitters and receivers to share an antenna. In some situations, the electronic device may be used across multiple different frequencies. An electrical balance duplexer (EBD) may be used to accommodate dynamic frequency usage compared to arrays of pass-band filters. The EBD may include balance-unbalance transformer (balun) circuits that include respective baluns that are coupled to impedance gradients that provide a respective impedance at a corresponding frequency to enable/block traversal of the balun. For example, some embodiments, may include a transmitter balun that is configured to receive a first impedance (e.g., a high impedance) at a first frequency from a transmitter impedance gradient to block signals from the antenna from crossing the transmitter balun to the transmitter while enabling signals from the transmitter to traverse the transmitter balun using a second impedance (e.g., a low impedance) at a second frequency from the transmitter impedance gradient. This frequency division is applied by the EBD because the first and second frequencies are different. For instance, the first and second frequency may fall in different (i.e., non-overlapping frequency bands).

A receiver balun may function similarly to the transmitter balun. For example, the receiver balun that is configured to receive a first impedance at a first frequency from a receiver impedance gradient to block signals from the transmitter from crossing the receiver balun to the receiver while enabling signals from the antenna to traverse the receiver balun using a second impedance at a second frequency from the receiver impedance gradient. This frequency division is applied by the EBD because the first and second frequencies are different. For instance, the first and second frequency may fall in different (i.e., non-overlapping frequency bands).

In some embodiments, the impedance gradients may be assisted using impedance tuners that reduce demands on the impedance gradients. For example, the impedance tuners may provide a low impedance in a pass band while matching an impedance of a corresponding impedance gradient in a block band.

BRIEF DESCRIPTION OF THE DRAWINGS

Various aspects of this disclosure may be better understood upon reading the following detailed description and upon reference to the drawings in which:

FIG. 3 is a front view of a hand-held device representing another embodiment of the electronic device of FIG. 1;

FIG. 4 is a front view of another hand-held device representing another embodiment of the electronic device of FIG. 1;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electronic devices may utilize one or more duplexers. Duplexers are devices that enable bidirectional communication over a single path while separating components that utilize the single path. For example, duplexers may separate a receiver for the electronic device from a transmitter for the electronic device that both share an antenna of the electronic device. Conventional duplexers may include filters of any kind to achieve this separation. For example, duplexers may include surface-acoustic wave (SAW) filters and/or bulk-acoustic waves (BAW) filters based on microacoustic principles or may include an inductor-capacitor-resistor (LCR) filter based on resonating circuits of inductors and capacitors to separate the transmitter and the receiver.

In addition to or alternative to SAW/BAW filters, a CMOS N-Path filter, a spatio-temporal circulator, or an electrical balanced duplexer (EBD) may be used in the duplexers. The EBD is a duplexer, which uses a balance-unbalance transformer (balun) in order to separate the differential signal from the common mode signal.

A substantial disadvantage of using the N-Path filter, spatio-temporal circulator, or the EBD exists in that these technologies have a higher insertion loss compared to using SAW/BAW filters. A further drawback regarding the EBD is that the traditional EBD uses an active replica of an antenna impedance in order to reach a highest isolation. Any antenna impedance shift may disturb the duplex function and degrade the isolation between the transmit path and the receive path. As discussed below in more detail, the EBD discussed herein differs from traditional EBDs in that a balun of the disclosed EBD in a balanced state is used to cut off the path to the antenna and not just to separate the differential signals of the receiver/transmitter from the common mode signal.

Figure 1:
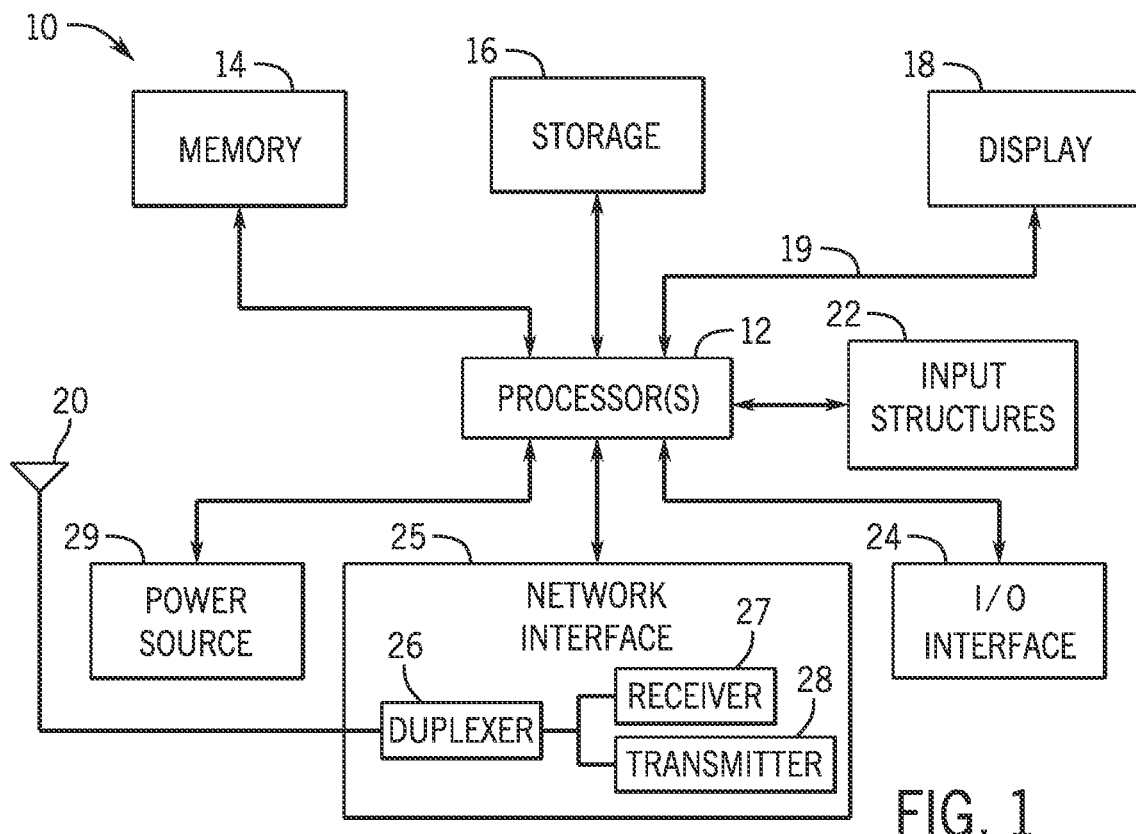
FIG. 1 is a block diagram of an electronic device that includes a duplexer, in accordance with an embodiments of the present disclosure.

With the foregoing in mind, there are many suitable electronic devices that may benefit from the embodiments of duplexers described herein. Turning first to FIG. 1, an electronic device 10 according to an embodiment of the present disclosure may include, among other things, one or more processor(s) 12, memory 14, nonvolatile storage 16, a display 18, antenna(s) 20, input structures 22, an input/output (I/O) interface 24, a network interface 25, and a power source 29. The various functional blocks shown in FIG. 1 may include hardware elements (including circuitry), software elements (including computer code stored on a computer-readable medium), or a combination of both hardware and software elements. It should be noted that FIG. 1 is merely one example of a particular implementation and is intended to illustrate the types of components that may be present in electronic device 10.

Figure 2:
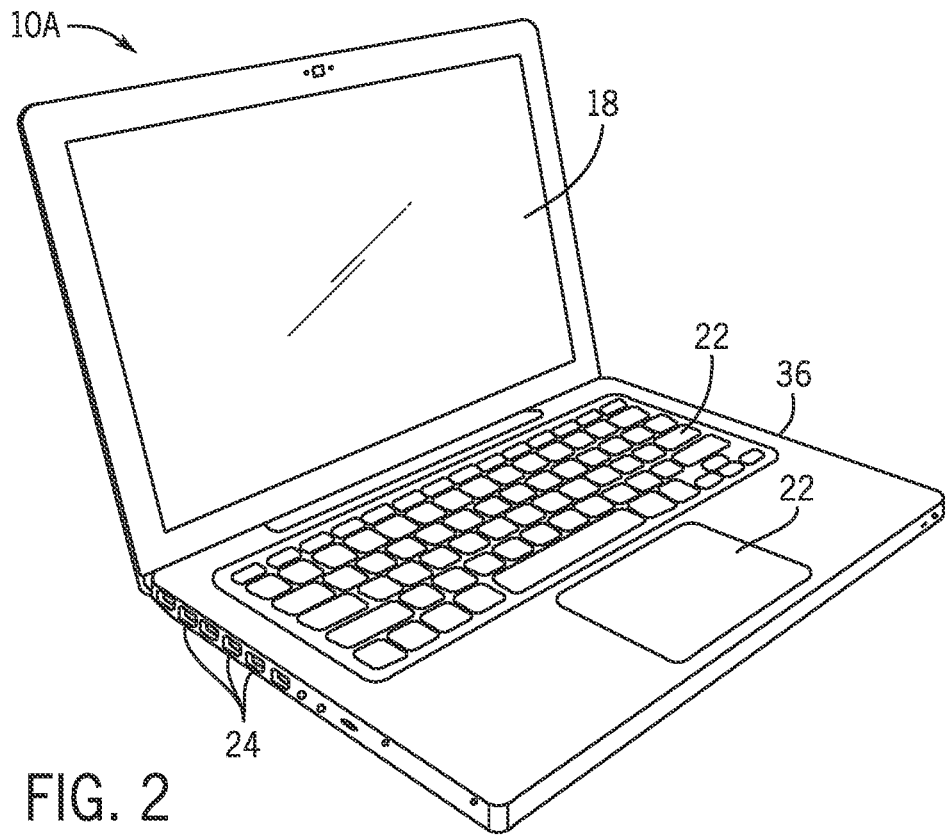
FIG. 2 is a perspective view of a notebook computer representing an embodiment of the electronic device of FIG. 1.
Figure 5:
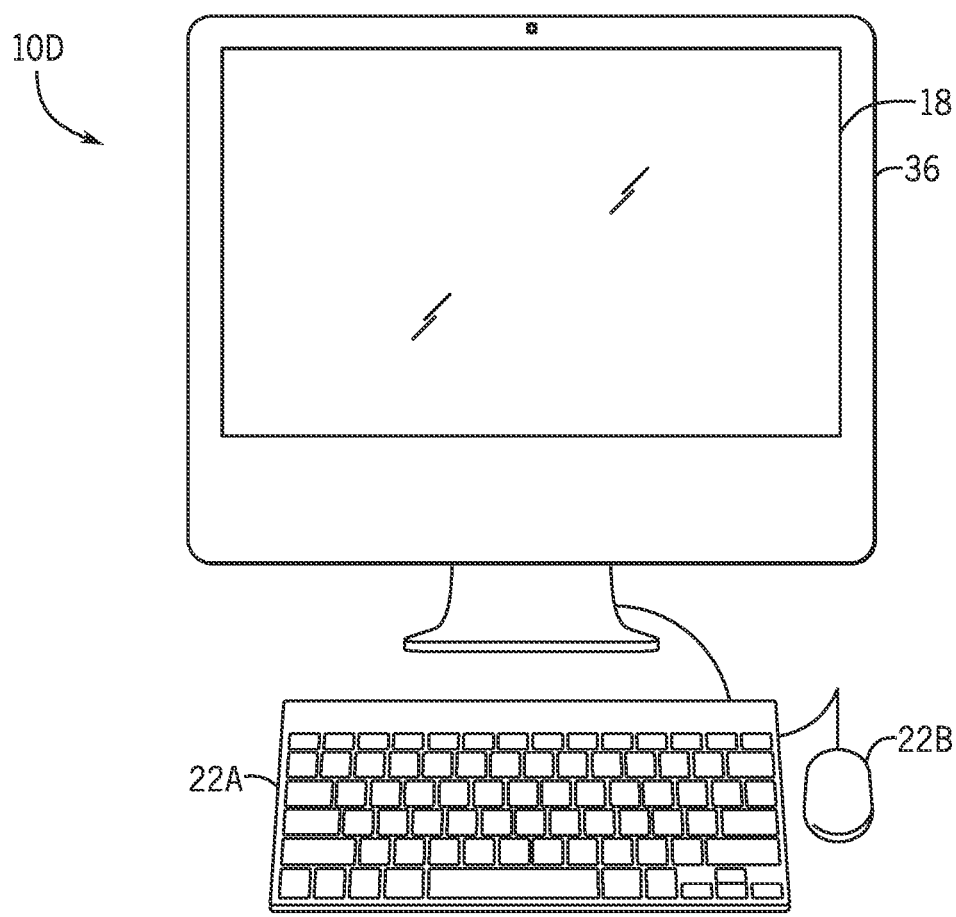
FIG. 5 is a front view of a desktop computer representing another embodiment of the electronic device of FIG. 1.
Figure 6:
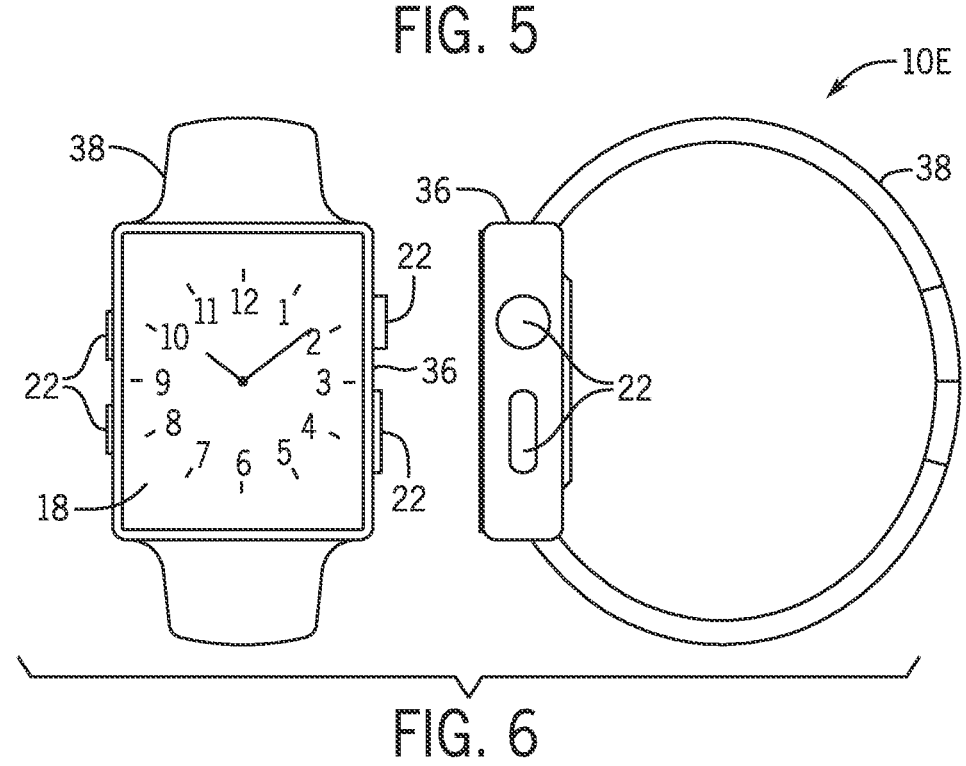
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 25. The network interface 25 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, universal mobile telecommunication system (UMTS), 4th generation (4G) cellular network, long term evolution (LTE) cellular network, or long term evolution license assisted access (LTE-LAA) cellular network, 5th generation (5G) cellular network, and/or 5G New Radio (5G NR) cellular network. The network interface 25 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. For example, network interfaces 25 may be capable of joining multiple networks, and may employ one or more antennas 20 to that end. Additionally or alternatively, the network interfaces 25 may include at least one duplexer 26 that enables multiple components (e.g., the receiver 27 and the transmitter 28) with separate paths (e.g., transmit path and receive path) to use one of the antennas 20 while providing separation between the multiple components. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MACBOOK®, MACBOOK® PRO, MACBOOK AIR®, IMAC®, MAC® MINI, OR MAC PRO® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an IPOD® OR IPHONE® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc., a universal serial bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an IPAD® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an IMAC®, a MACBOOK®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various input structures 22, such as the keyboard 22A or mouse 22B, which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 38, may be an APPLE WATCH® by Apple Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
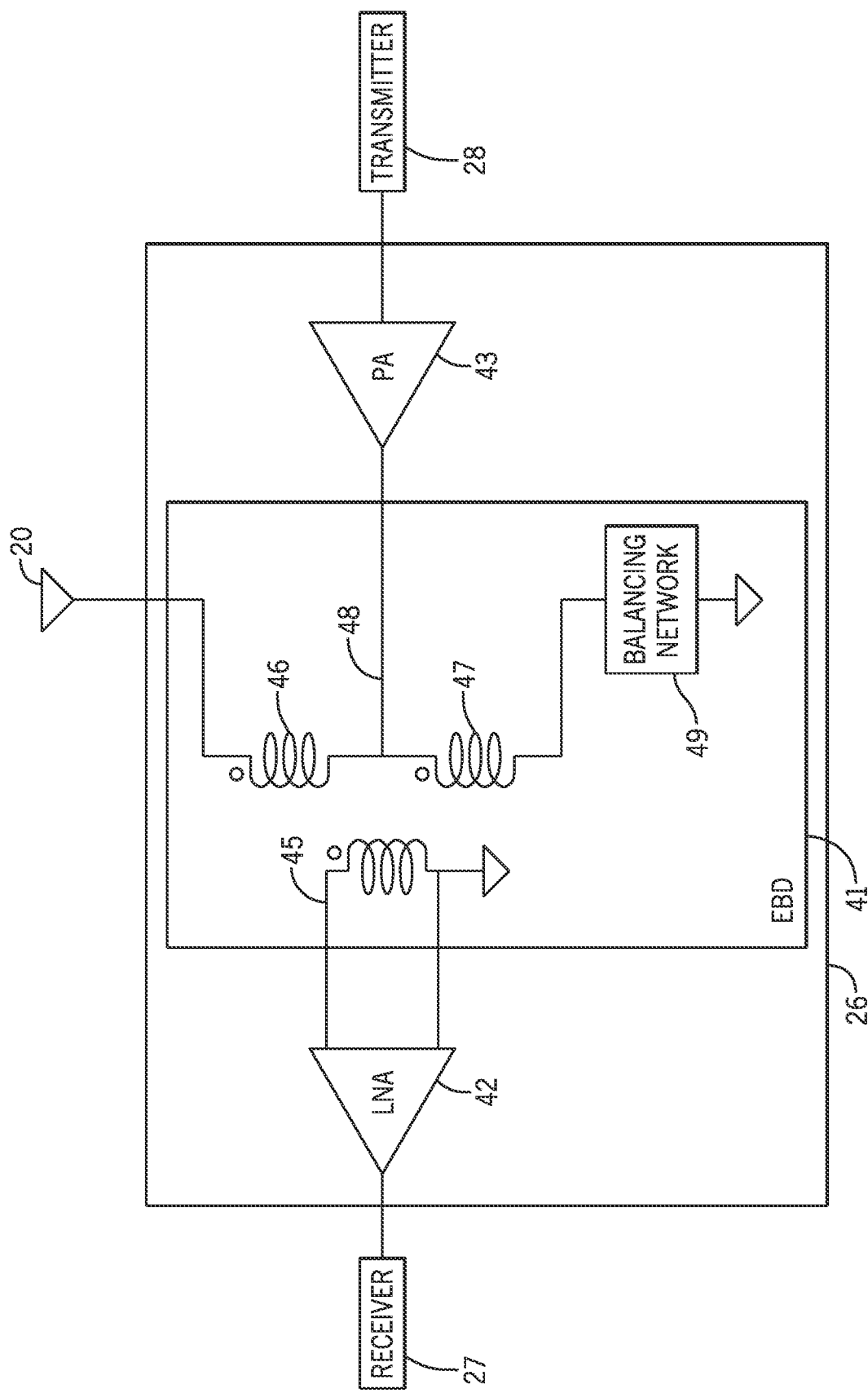
FIG. 7 is a schematic diagram of the duplexer of FIG. 1 having an electrical balance duplexer (EBD), in accordance with embodiments of the present disclosure.

With the foregoing in mind, FIG. 7 illustrates an embodiment of the duplexer 26 that includes an EBD 41. As illustrated, the EBD 41 provides isolation between the receiver 27 and the transmitter 28 while enabling both the receiver 27 and the transmitter 28 to utilize the antenna 20. As illustrated, the duplexer 26 may include a low-noise amplifier (LNA) 42 that may be used to amplify received signals for the receiver 27. In some embodiments, an iteration of the LNA 42 may be located within the receiver 27 in addition to or alternative the LNA 42 within the duplexer 26. In some embodiments, an iteration of the LNA 42 may be located within the receiver 27 in addition to or alternative the LNA 42 within the duplexer 26. The duplexer 26 may also include a power amplifier (PA) 43 that receives signals from the transmitter 28. The PA 43 amplifies the signals to a suitable level to drive the transmission of the signals via the antenna 20. In some embodiments, an iteration of the PA 43 may be located within the transmitter 28 in addition to or alternative the PA 43 within the duplexer 26. These signals are to be transmitted via the antenna 20.

The EBD 41 includes a secondary winding 45 that may be used to selectively pass a signal from the antenna to the LNA 42 (and to the receiver 27) via primary windings 46 and/or 47. Signals from the PA 43 (and from the transmitter 28) are passed to antenna 20 via a line 48 coupled between the primary windings 46 and 47. A balancing network 49 of the EBD 41 may be used to actively replicate an impedance of the antenna 20 to maximize isolation between the receiver 27 and the transmitter 28. However, if the impedance of the antenna 20 shifts, a duplexer function of the duplexer 26 is disturbed and the isolation between the receiver 27 and the transmitter 28 are degraded. Instead, the duplexer 26 may use an alternative arrangement of the EBD 41, such as embodiments of the duplexer 26 illustrated in FIGS. 8-13, that reduce the insertion loss resulting from using the EBD 41 in FIG. 7 while eliminating the antenna replica dependency of FIG. 7 to improve flexibility of frequencies used in the duplexer 26.

Figure 8:
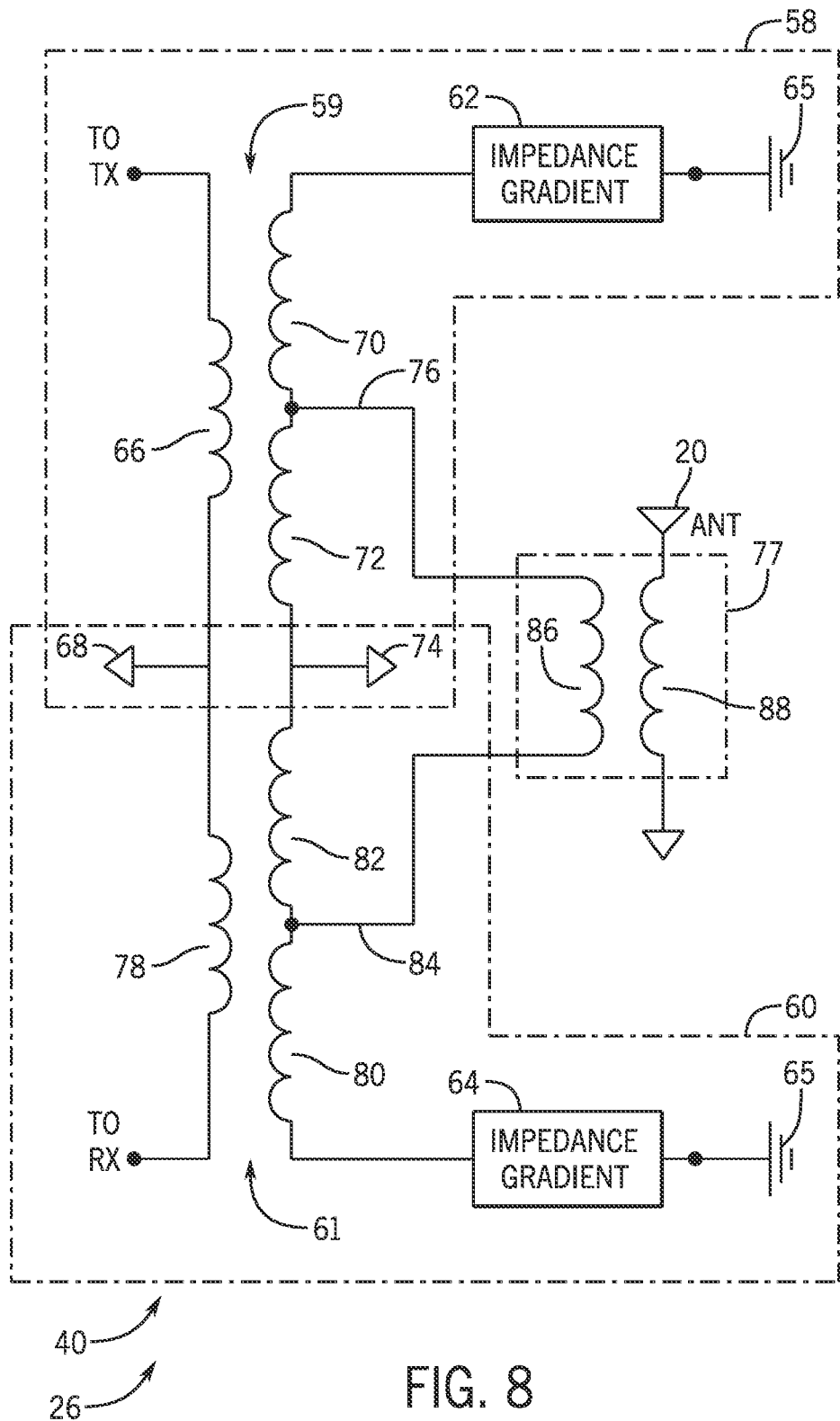
FIG. 8 is a schematic diagram for an alternative embodiment of the EBD of FIG. 7 having a transmitter impedance gradient and a receiver impedance gradient, in accordance with embodiments of the present disclosure.

FIG. 8 is a simplified block diagram of an embodiment of the duplexer 26 with an EBD 41 that does not include the antenna replica dependency present in FIG. 7. As illustrated, the duplexer 26 is coupled to the antenna 20 and provides selective access to and from the antenna 20 by the receiver 27 and the transmitter 28 of the electronic device 10. The duplexer 26 includes transmitter balun circuitry 58 having a transmitter balun 59 and receiver balun circuitry 60 having a receiver balun 61. The transmitter 28 is coupled to a first side of the transmitter balun 59 while the receiver 27 is coupled to a corresponding first side of the receiver balun 61.

The transmitter balun circuitry 58 and the receiver balun circuitry 60 each enables a corresponding path (e.g., between the antenna 20 and the receiver 27/the transmitter 28) to be blocked or allowed. This selective blocking/passing may be set for the transmitter balun circuitry 58 using an impedance gradient 62 coupled to a second side of the transmitter balun 59 opposite the connection to the transmitter 28, and the state may be set for the receiver balun circuitry 60 using an impedance gradient 64 coupled to a second side of the receiver balun 61 opposite the connection to the receiver 27. The impedance gradients 62 and 64 may be implemented using discrete lumped components or distributed components that set desired impedances for certain frequencies and may couple certain frequencies to ground 65 with a low impedance. Regardless of implementation type, the impedance gradients 62 and 64 act as filters having a relative high impedance in a "pass" band compared to a relative low impedance (e.g., short to ground 65) in a "block" band.

Furthermore, the transmitter balun 59 includes a winding 66 that may produce an electromagnetic field due to excitation due to the connection of the winding 66 to the transmitter 28 and a common return 68 (e.g., ground). The field generated at the winding 66 may cause resulting signals in windings 70 and/or 72 depending on the frequency range of the signals and the impedance provided by the impedance gradient 62 in that frequency range. The impedance gradient 62 is coupled to the winding 70 and a connection of the winding 72 to a common return 74. A line 76 is coupled between the windings 70 and 72 to enable the signals from the transmitter 28 to the antenna 20 via an antenna balun 77 when the transmitter balun 59 is set to pass transmission signals using the impedance gradients 62 and/or 64.

The receiver balun 61 includes a winding 78 that may generate a signal based on an electromagnetic field generated by windings 80 and/or 82 based on the impedance gradient 64 providing an impedance to the receiver balun 61 that enables passing of signals across the receiver balun 61. A line 84 between the windings 80 and 82 couples the pair of windings 80 and 84 to the antenna balun 77. Specifically, the lines 76 and 84 are coupled to opposite ends of a winding 86 of the antenna balun 77. The impedance gradients 62 and 64 cause a transmission signal to be passed to the line 76, when the duplexer 26 permits transmission of signals having a transmission frequency. The passing of the transmission signal causes the winding 86 to generate an electromagnetic field that induces a signal on a secondary winding 88 of the antenna balun 77 that is passed to the antenna 20 to be broadcast.

The impedance gradients 62 and 64 cause a received signal to be passed from the antenna to the receiver 27, when the duplexer 26 permits signals having a receive frequency using an impedance from the impedance gradient 64. Although the illustrated embodiment includes a single antenna balun 77 to provide connection to the antenna 20, any other suitable implementation used to transmit signals between the antenna 20 and a corresponding lines 76 and 84.

Figure 9:
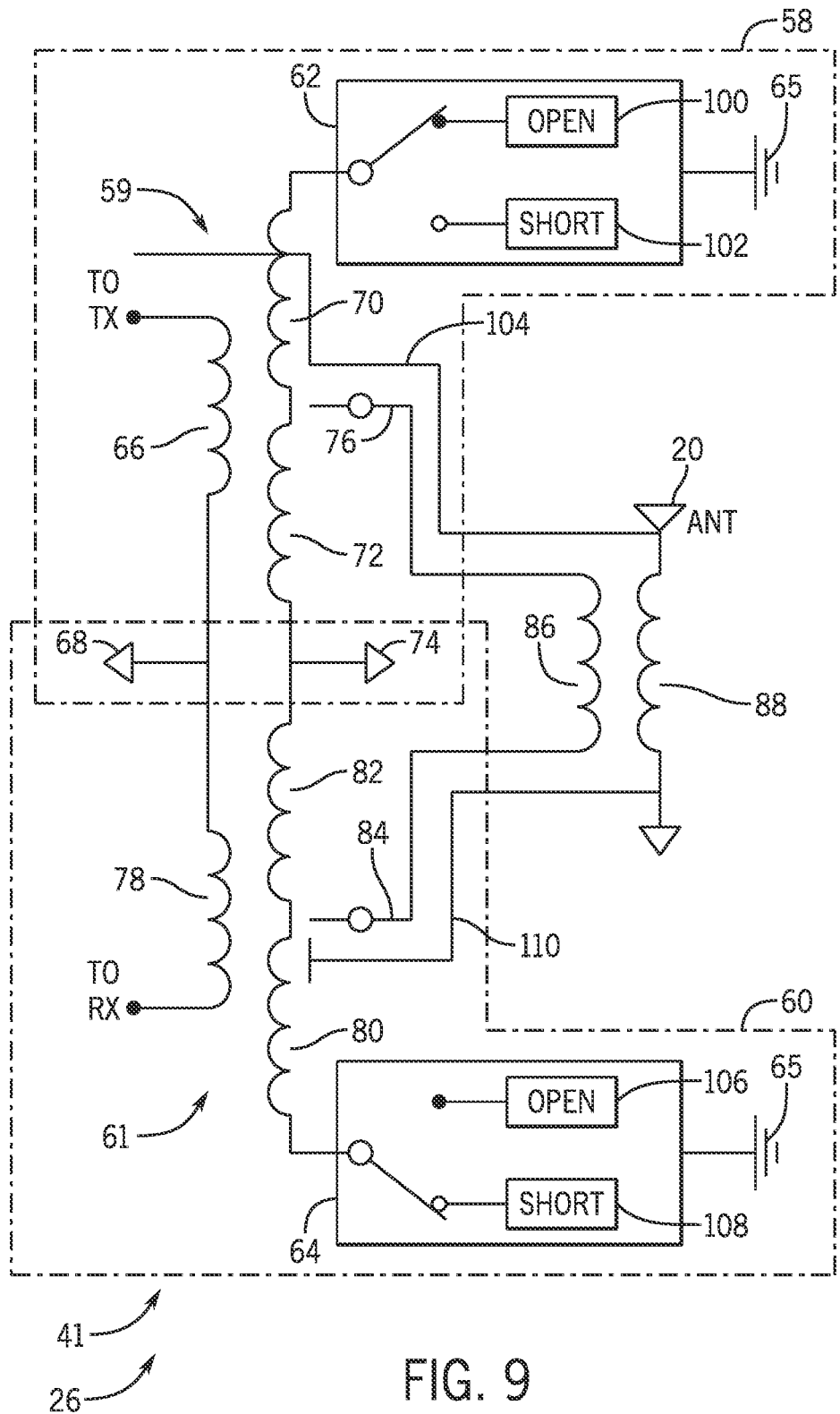
FIG. 9 is a schematic diagram of the EBD of FIG. 8 with the transmitter impedance gradient causing a transmitter balun to enable transmission of signals to an antenna and the receiver impedance gradient causing a receiver balun to block transmission of the signals to the receiver, in accordance with embodiments of the present disclosure.

FIG. 9 is a schematic diagram illustrating the duplexer 26 in a transmission mode for at least one transmission frequency. As previously noted, the impedance gradient 62 acts a filter that provides a high impedance for a pass band. For example, the impedance gradient 62 may select an "open" position 100 instead of a "short" position 102. The "open" position 100 connects the winding 70 to a relatively high impedance compared to a relatively low impedance provided when the short position 102 is selected to provide a low impedance path to ground 65. As illustrated, the impedance gradient 62 may be in a transmission mode for the transmission frequency. With the impedance gradient 62 configured to provide a high impedance path for the winding 80 at the transmission frequency, transmission signals from the transmitter 28 are passed in a transmission path 104 across the transmitter balun 59 and ultimately to the antenna 20.

The impedance gradient 64 functions similar to the impedance gradient 62 except that the impedance gradient 64 is to block transmission frequencies from being transmitted to the receiver 27 when in the transmission frequency. To achieve this isolation, the impedance gradient 64 is set to select between coupling the winding 80 to a "open" position 106 and a "short" position 108, each respectively similar to the "open" position 100 and the "short" position 102. Since the duplexer 26 is to block the transmission frequency from the receiver 27, the impedance gradient 64 provides a low impedance connection to the winding 80 for the transmission frequency. With the impedance gradient 62 configured to provide a low impedance path for the winding 80 at the transmission frequency, transmission signals from the antenna 20 are passed in a transmission path 110 until being stopped from transference across the receiver balun 61 due to the low impedance connection provided by the impedance gradient 64 to the winding 80.

Figure 10:
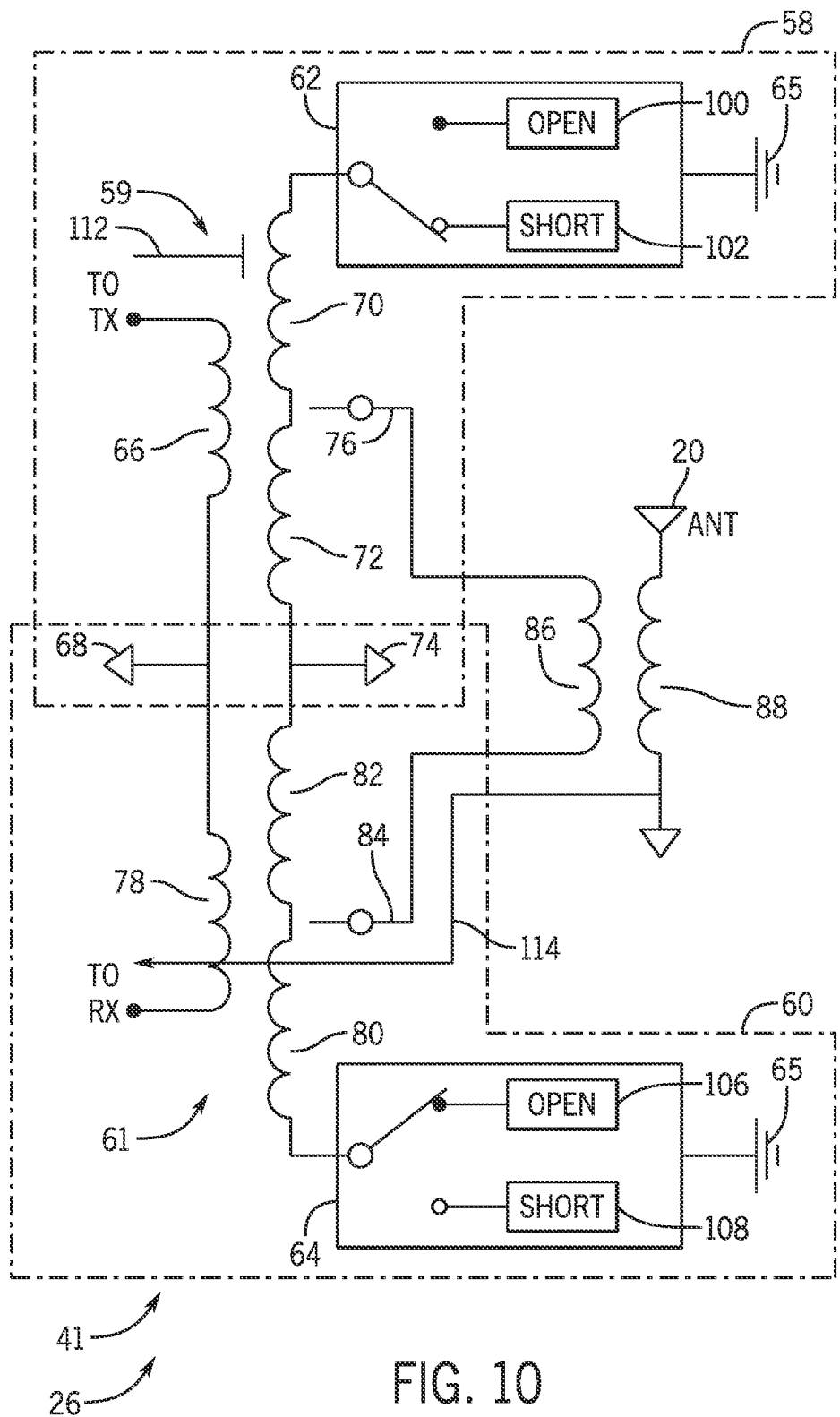
FIG. 10 is a schematic diagram of the EBD of FIG. 8 with the transmitter impedance gradient causing a transmitter balun to block transmission of signals having a transmission frequency from the transmitter to an antenna and the receiver impedance gradient causing a receiver balun to enable transmission of signals having a receive frequency to the receiver, in accordance with embodiments of the present disclosure.

Since the EBD 41 has two impedance gradients 62 and 64 that may be controlled individually and block corresponding frequencies, the EBD 41 may be used to implement the duplexer 26 as a frequency division duplexer. FIG. 10 is a schematic diagram illustrating the duplexer 26 for at least one receive frequency. The receiver mode of the duplexer 26 for the receive frequency includes the impedance gradient 62 coupling the winding 70 to a low impedance path causing a transmission path 112 to be blocked preventing transference of transmission signals across the transmitter balun 59. Furthermore, the receiver mode of the duplexer 26 for the receive frequency includes the impedance gradient 64 coupling the winding 80 to a high impedance path causing received signals to be passed along a receive path 114 from the antenna 20 to the receiver 27 via receiver balun 61.

With the impedance gradient 62 configured to provide a high impedance path for the winding 80 at the transmission frequency, transmission signals from the transmitter 28 are passed in a transmission path 104 across windings 66 and 72 to the line 76 and ultimately to the antenna 20.

Figure 11:
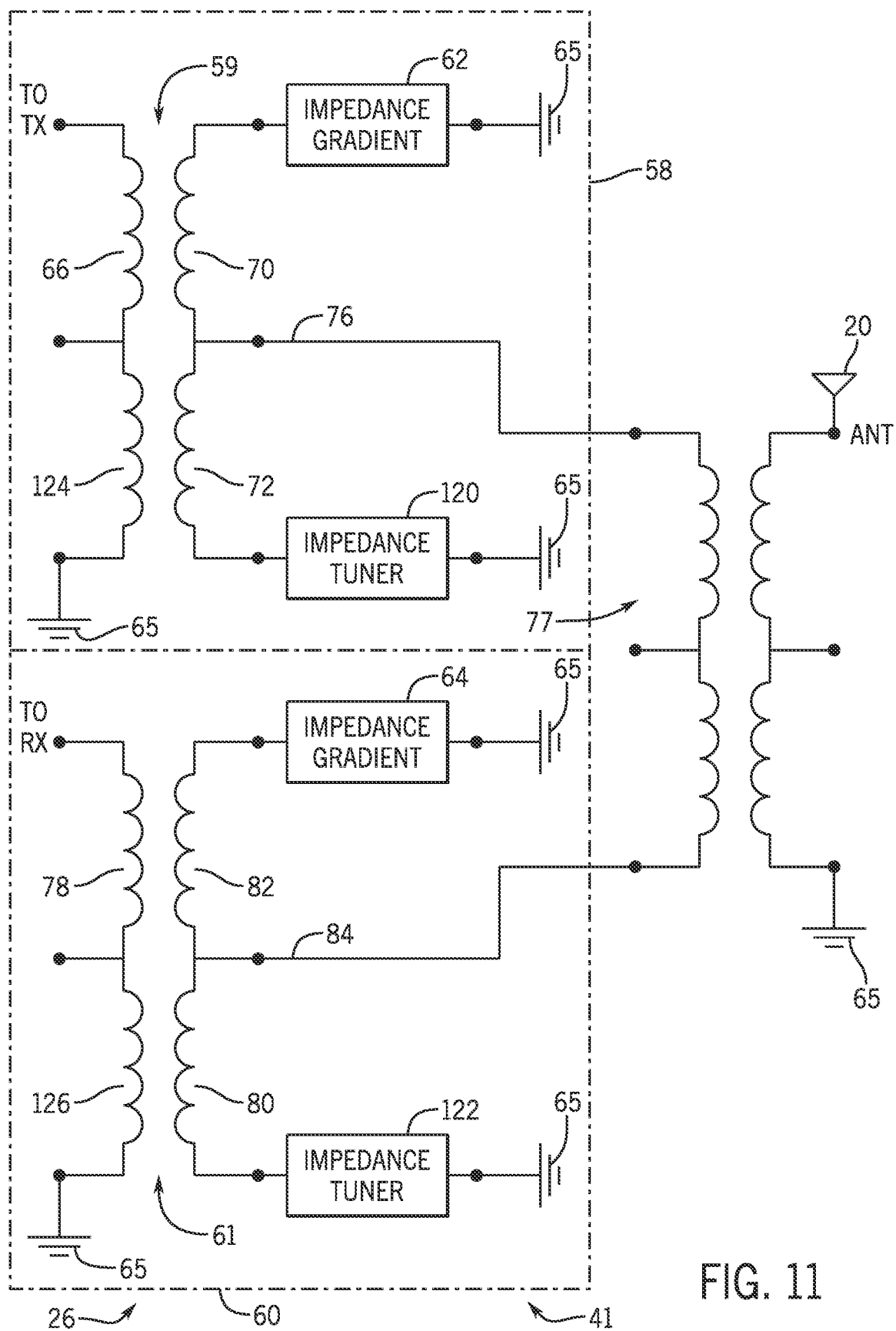
FIG. 11 is a schematic diagram of the EBD of FIG. 8 with impedance tuners for each impedance gradient, in accordance with embodiments of the present disclosure.
Figure 12:
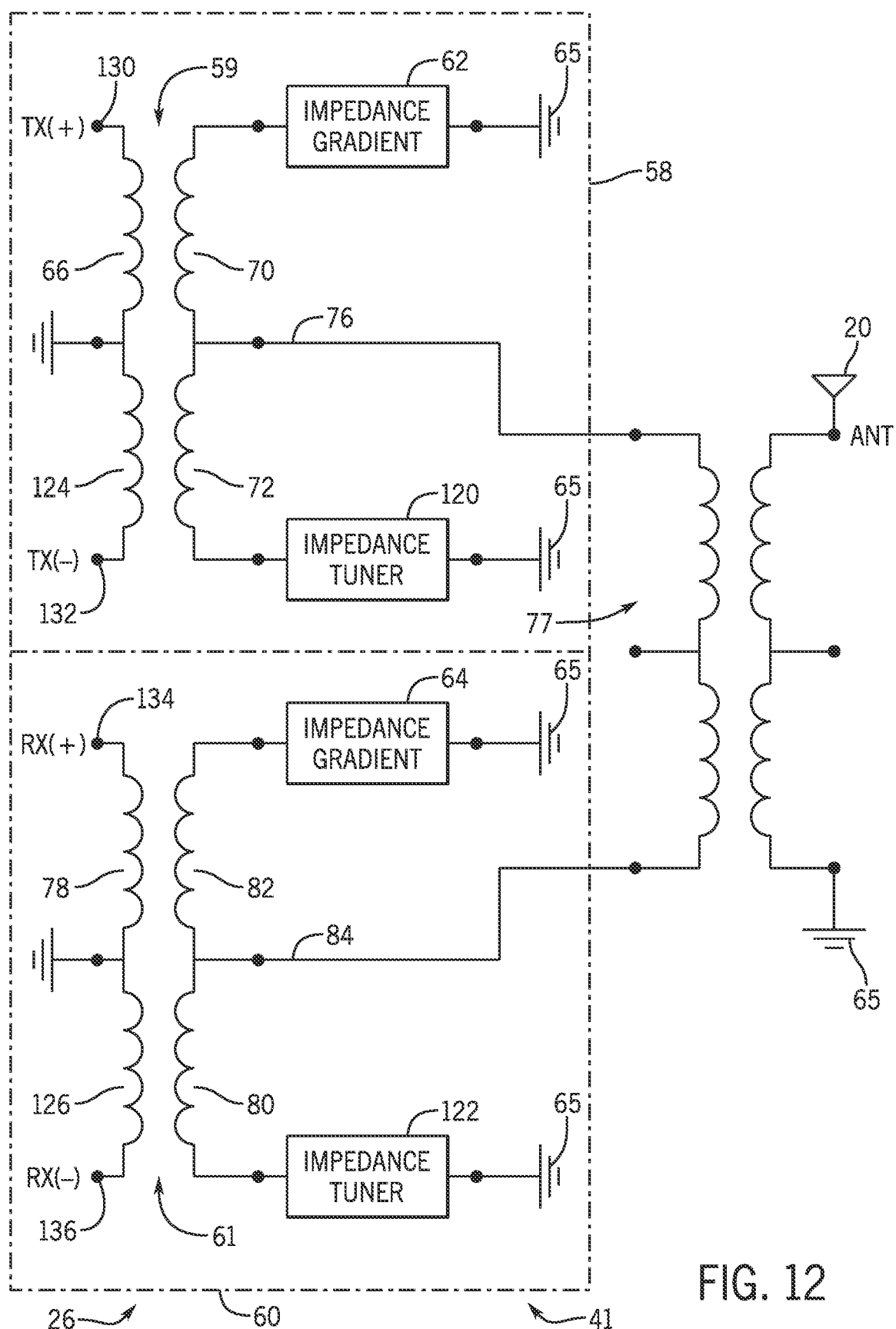
FIG. 12 is a schematic diagram of the EBD of FIG. 11 with differential signals to be transmitted from the transmitter and differential signals to be received by the receiver, in accordance with embodiments of the present disclosure.

Since the impedance gradients 62 and 64 may be implemented using real-word components, the high impedance and low impedance settings for impedance gradients 62 and 64 may be values other than ideal short and open values (e.g., 0Ω and ∞Ω). To address the non-ideal operation of the impedance gradients 62 and 64, an additional component, an impedance tuner, may be used to compensate for such non-ideal values of impedances. Furthermore, a concern in operation of the EBD 41 can be an abrupt change in impedance at the transmission and receive frequencies. By using the impedance tuner, the demands on the impedance gradients 62 and 64 may also be reduced. FIG. 11 illustrates an embodiment of the duplexer 26 with impedance tuners 120 and 122. Whereas the impedance gradients 62 and 64 act as filters, the impedance tuners 120 have a low impedance in the "pass" band for the respective balun and replicates the impedance of the corresponding impedance gradient in the "block" band. In other words, in some embodiments, the impedance tuners 120 and 122 may always provide a low impedance lower than the high impedance of a corresponding impedance gradient for passed frequencies while providing a similar low impedance that is provided by the corresponding impedance gradient for blocked frequencies.

The illustrated embodiment of the EBD 41 in FIG. 11 also includes windings 124 and 126 that respectively supplement the windings 66 and 78. However, in some embodiments, the windings 66 and 124 may be combined into a single winding, and the windings 78 and 126 may be combined into a single winding.

Since signals to the receiver 27 and from the transmitter 28 may be differential signals, some embodiments of the EBD 41 may address differential transmittance of such signals. For instance, in FIG. 12, the EBD 41 includes a positive transmitter terminal 130 and a negative transmitter terminal 132 that together form a differential signal from the transmitter 28 (e.g., via the PA 43). Thus, in the EBD 41 of FIG. 12, the transmitter balun 59 may be used to convert the differential signal from the transmitter 28 to a single signal on the line 76. Similarly, the EBD 41 of FIG. 12 includes a positive receiver terminal 134 and a negative receiver terminal 136 that together form a differential signal to the receiver 27 (e.g., via the LNA 42). Thus, in the EBD 41 of FIG. 12, the receiver balun 61 may be used to convert the single signal on the line 84 to a differential signal suitable for the receiver 27.

Figure 13:
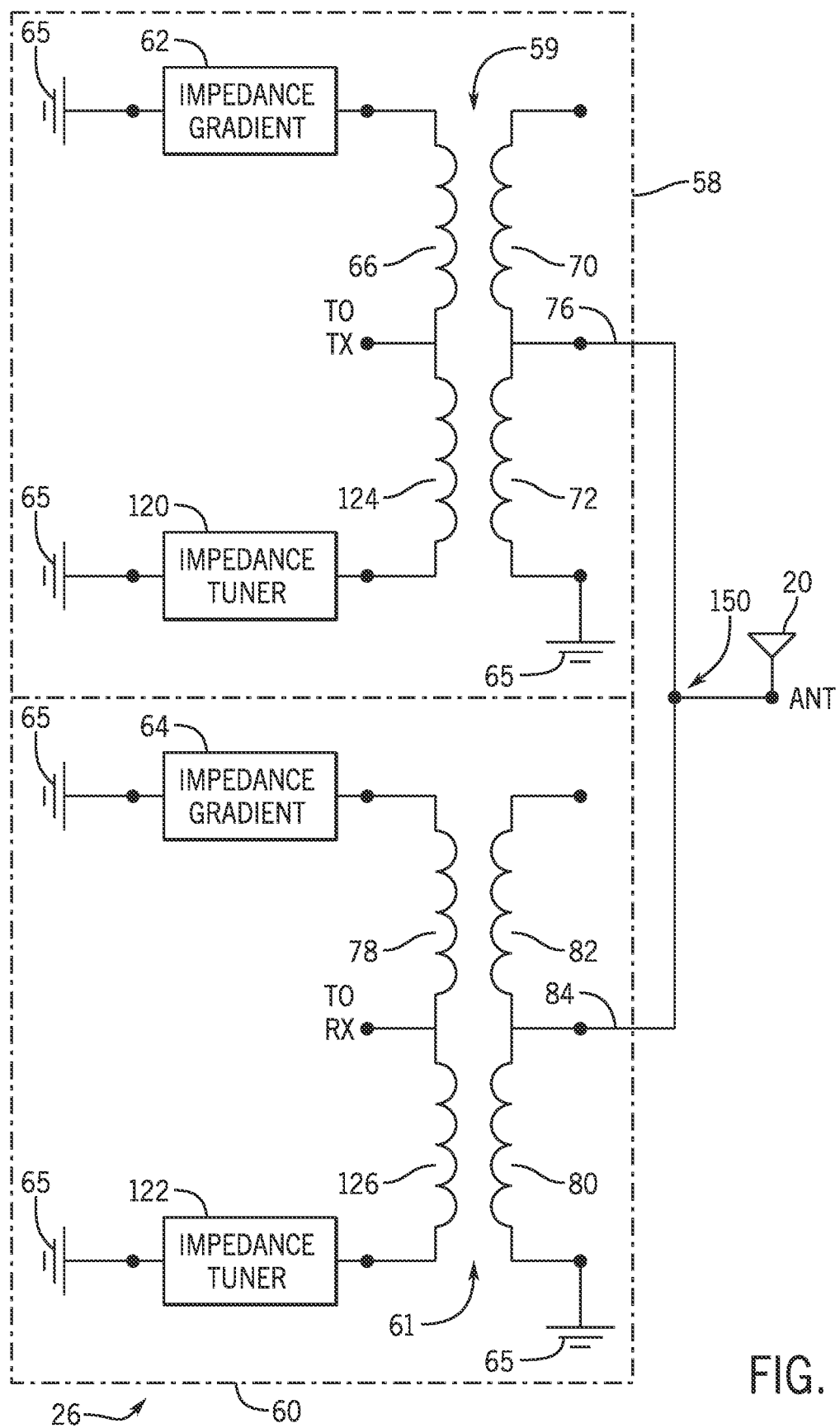
FIG. 13 is an alternative embodiment of the EBD of FIG. 8 with the impedance gradients and impedance tuners on a same side of a corresponding balun with the transmitter/receiver, in accordance with embodiments of the present disclosure.

The impedance gradients 62 and 64 and the impedance tuners 120 and 122 have been illustrated on as coupled to the corresponding baluns at a side opposite side (e.g., secondary winding-side of the transmitter balun 59) than the receiver 27 or the transmitter 28 in the foregoing embodiments. However, the impedance gradients 62 and 64 and the impedance tuners 120 and 122 may be coupled to the same respective side (e.g., the primary winding-side of the transmitter balun 59) as the receiver 27 or the transmitter 28. FIG. 13 illustrates a schematic diagram of an embodiment of the duplexer 26 having such an arrangement. As illustrated, the transmitter 28 is coupled to the transmitter balun 59 between the windings 66 and 124, and the receiver 27 is coupled to the receiver balun 61 between the windings 78 and 126. Moreover, the impedance gradient 62 is coupled between the winding 66 and ground 65 instead of between the winding 70 and ground 65 illustrated in previous embodiments. Furthermore, the impedance tuner 120 is coupled between the winding 124 and ground 65 instead of between the winding 72 and ground 65 illustrated in previous embodiments. Moreover, the impedance gradient 64 is coupled between the winding 78 and ground 65 instead of between the winding 82 and ground 65 illustrated in previous embodiments. Furthermore, the impedance tuner 122 is coupled between the winding 126 and ground 65 instead of between the winding 80 and ground 65 illustrated in previous embodiments. In some embodiments, the impedance tuners 120 and 122 may be omitted from the duplexer 26 of FIG. 13.

Figure 14:
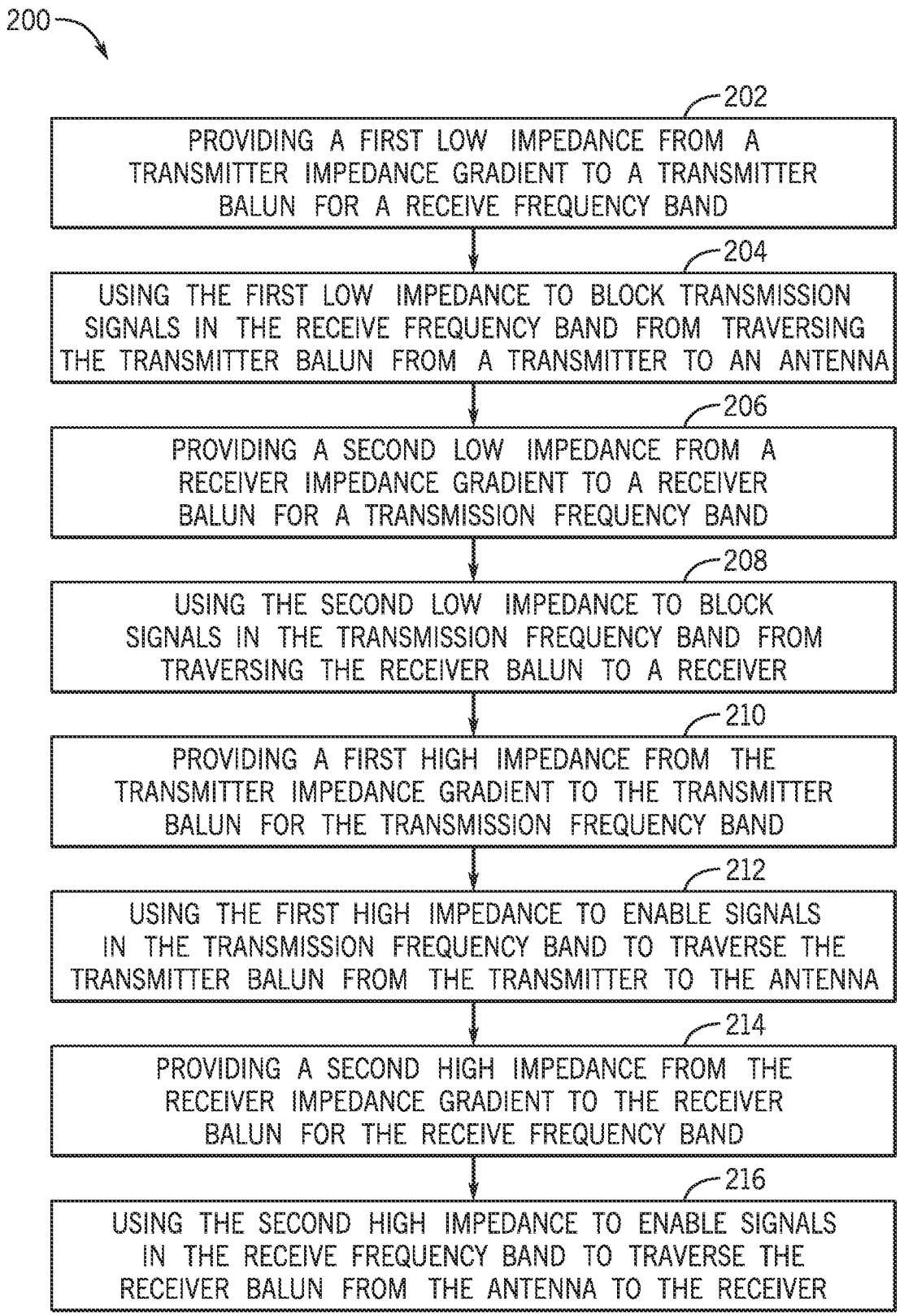
FIG. 14 is a block diagram of process used by the EBD of FIGS. 8-13, in accordance with embodiments of the present disclosure.

FIG. 14 is flow diagram of a process 200 that may be used by the embodiments of the EBD 41 discussed in relation to FIGS. 8-13. The process 200 includes the impedance gradient 62 providing a first low impedance to the transmitter balun 59 for a receive frequency band (block 202). The transmitter balun 59 uses the first low impedance to block transmission signals in the receive frequency band from traversing the transmitter balun 59 from the transmitter 28 to the antenna 20 (block 204). The impedance gradient 64 provides a second low impedance to the receiver balun 61 for a transmission frequency band (block 206). The first low impedance and the second low impedance may be the same impedance level or may be different impedance levels. The receiver balun 61 then uses the second low impedance to block signals in the transmission frequency band from traversing the receiver balun 61 to the receiver 27 (block 208).

The impedance gradient 62 also provides a first high impedance to the transmitter balun 59 for the transmission frequency band (block 210). The transmitter balun 59 uses the first high impedance to enable signals in the transmission frequency band to traverse the transmitter balun 59 from the transmitter 28 to the antenna 20 (block 212). The impedance gradient 64 provides a second high impedance to the receiver balun 61 for the receive frequency band (block 214). The receiver balun 61 uses the second high impedance to enable signals in the receive frequency band to traverse the receiver balun 61 from the antenna 20 to the receiver 27 (block 216).

In addition, the impedance tuner 120 provides a third low impedance to the transmitter balun 59 for the transmission frequency band to enhance traversal of the transmitter balun 59 by the signals in the transmission frequency band. The third low impedance may be equal the first low impedance and/or the second low impedance. Alternatively, the third low impedance may be different than the first low impedance and the second low impedance. The impedance tuner 120 also provides the first low impedance to the transmitter balun 59 for the receive frequency band to aid the transmitter balun in blocking the signals in the receive frequency band.

The impedance tuner 122 provides a fourth low impedance to the receiver balun 61 for the receive frequency band to enhance traversal of the receiver balun 61 by the signals in the receive frequency band. The fourth low impedance may be equal the first low impedance, the second low impedance, and/or the third low impedance. Alternatively, the fourth low impedance may be different than the first low impedance, the second low impedance, and the third low impedance. The impedance tuner 122 also provides the second low impedance to the receiver balun 61 for the transmission frequency band to aid the receiver balun 61 in blocking the signals in the transmission frequency band.

The specific embodiments described above have been shown by way of example, and it should be understood that these embodiments may be susceptible to various modifications and alternative forms. For example, the methods may be applied for embodiments having different numbers and/or locations for antennas, different groupings, and/or different networks. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electrical balance duplexer for transmission and reception of signals via an antenna, the electrical balance duplexer comprising:
   a transmitter balun having a first side coupled to a transmitter using one or more transmit signals that are differential signals from the transmitter, the transmitter balun having a second side inductively coupled to the first side;
   a transmitter impedance gradient coupled to a first set of windings on the second side of the transmitter balun between the transmitter balun and a first ground connection; and
   a transmitter impedance tuner coupled to a second set of windings on the second side of the transmitter balun between the transmitter balun and a second ground connection, wherein the transmitter impedance tuner and the transmitter impedance gradient are configured to:
   in a transmit mode, cause the one or more transmit signals to traverse the transmitter balun to the antenna connected to the second side and the antenna between the first and second sets of windings, the traversal of the one or more signals based on transmit frequencies of the one or more transmit signals, and
   in a receive mode, block the one or more transmit signals from traversing the transmitter balun to the antenna from the transmitter by transmitting the one or more transmit signals to the first and second ground connection based on transmit frequencies of the one or more transmit signals.

2. The electrical balance duplexer of claim 1, the first side of the transmitter balun having third and fourth sets of windings coupled in series with the differential signals from the transmitter coupled at opposite ends of the series of the third and fourth sets of windings.

3. The electrical balance duplexer of claim 2, the first side of the transmitter balun having a third ground connection between the third and fourth sets of windings.

4. The electrical balance duplexer of claim 1, the transmitter impedance gradient being configured to provide a first impedance in the transmit mode and a second impedance in the receive mode for the transmit frequencies.

5. The electrical balance duplexer of claim 1, the transmitter impedance tuner being configured to provide a first impedance in the transmit mode and a second impedance in the receive mode for the transmit frequencies.

6. The electrical balance duplexer of claim 1, the transmitter impedance gradient being located adjacent to a positive terminal of the first side configured to receive a positive differential signal from the transmitter.

7. The electrical balance duplexer of claim 6, the transmitter impedance tuner being located adjacent to a negative terminal of the first side configured to receive a negative differential signal from the transmitter.

8. The electrical balance duplexer of claim 1, further comprising a receiver balun having a third side coupled to a receiver using one or more receive signals that are differential receiver signals to the receiver, the receiver balun having a fourth side inductively coupled to the third side.

9. The electrical balance duplexer of claim 8, further comprising a receiver impedance gradient coupled to a fifth set of windings on the fourth side of the receiver balun between the receiver balun and a fourth ground connection, and a receiver impedance tuner coupled to a sixth set of windings on the fourth side of the receiver balun between the receiver balun and a fifth ground connection.

10. The electrical balance duplexer of claim 9, the receiver impedance tuner and the receiver impedance gradient being configured to, in a receive mode, cause the one or more receive signals to traverse the receiver balun from the antenna connected to the fourth side between the fifth and sixth sets of windings to differential terminals of the receiver coupled to the third side, the traversal of the one or more receive signals based on receive frequencies of the one or more receive signals.

11. The electrical balance duplexer of claim 10, the receiver impedance tuner and the receiver impedance gradient being configured to, in a transmit mode, block one or more receive signals from traversing the receiver balun from the antenna to the receiver by transmitting the one or more receive signals to the fourth and fifth ground connections based on the receive frequencies of the one or more receive signals.

12. The electrical balance duplexer of claim 10, the receiver balun comprising a sixth ground connection between windings of the third side between differential receiver terminals coupled at opposite ends of the windings of the third side.

13. An electrical balance duplexer for transmission and reception of signals via an antenna, the electrical balance duplexer comprising:
   a transmitter balun having a first side coupled to a transmitter and a second side inductively coupled to the first side;
   the antenna coupled to the second side;
   a transmitter impedance gradient coupled to the first side of the transmitter balun between the transmitter balun and a ground connection; and
   a transmitter impedance tuner coupled to the first side of the transmitter balun between the transmitter balun and the ground connection, wherein the transmitter impedance gradient and the transmitter impedance tuner are configured to:
  in a receive mode, block one or more transmit signals from traversing the transmitter balun to the antenna based on a transmit frequency of the one or more transmit signals by transmitting the one or more transmit signals to the ground connection, and
  in a transmit mode, pass the one or more transmit signals to the antenna based on the transmit frequency.

14. The electrical balance duplexer of claim 13, further comprising a receiver balun having a third side coupled to a receiver and a fourth side inductively coupled to the third side with the antenna coupled to the fourth side.

15. The electrical balance duplexer of claim 14, further comprising a receiver impedance gradient coupled to the third side of the receiver balun between the receiver balun and the ground connection.

16. The electrical balance duplexer of claim 15, further comprising a receiver impedance tuner coupled to the third side of the receiver balun between the receiver balun and the ground connection.

17. The electrical balance duplexer of claim 16, the receiver impedance gradient and the receiver impedance tuner being configured to, in a transmit mode, block one or more receive signals from traversing the receiver balun from the antenna to the receiver based on a receive frequency of the one or more receive signals by transmitting the one or more receive signals to the ground connection.

18. The electrical balance duplexer of claim 17, the receiver impedance gradient and the receiver impedance tuner being configured to, in a receive mode, pass one or more receive signals from the antenna across the receiver balun to the receiver based on the receive frequency.

19. An electrical balance duplexer for transmission and reception of signals via an antenna, the electrical balance duplexer comprising:
  a receiver balun having a first side coupled to a receiver and a second side inductively coupled to the first side, the receiver balun having first sets of windings across the first and second sides; and
  a receiver impedance gradient coupled to a first end of the first sets of windings and between the receiver balun and a ground connection; and
  a receiver impedance tuner coupled to a second end of the first sets of windings opposite of the first end and between the receiver balun and the ground connection, the receiver impedance gradient and the receiver impedance tuner being configured to:
    in a receive mode, cause one or more receive signals to traverse the receiver balun to the receiver from the antenna, and
    in a transmit mode, block the one or more receive signals from traversing the receiver balun to the receiver from the antenna by transmitting the one or more receive signals to the ground connection.

20. The electrical balance duplexer of claim 19, a transmitter balun having a third side coupled to a transmitter and a fourth side inductively coupled to the third side, the transmitter balun having second sets of windings across the third and fourth sides;
  a transmitter impedance gradient coupled to a third end of the second sets of windings and between the transmitter balun and the ground connection; and
  a transmitter impedance tuner coupled to a fourth end of the second sets of windings opposite of the third end and between the transmitter balun and the ground connection, the transmitter impedance gradient and the transmitter impedance gradient being configured to, in a transmit mode, cause one or more transmit signals to traverse the transmitter balun from the transmitter to the antenna, and, in a receive mode, block the one or more transmit signals from traversing the receiver balun to the antenna from the transmitter by transmitting the one or more transmit signals to the ground connection, the receiver balun being configured to transmit the one or more receive signals to the receiver as differential signals, and the transmitter balun being configured to receive the one or more transmit signals from transmitter as differential signals.

* * * * *